United States Patent [19]
Park

[11] Patent Number: 6,067,067
[45] Date of Patent: May 23, 2000

[54] SCAN DRIVER IC FOR A LIQUID CRYSTAL DISPLAY

[75] Inventor: Ki Pan Park, Seoul, Rep. of Korea

[73] Assignee: LG Electronics Inc., Seoul, Rep. of Korea

[21] Appl. No.: 08/996,815

[22] Filed: Dec. 23, 1997

[30] Foreign Application Priority Data

Jan. 8, 1997 [KR] Rep. of Korea ............ 97-00293

[51] Int. Cl.[7] .................. G09G 3/36; G09G 5/00
[52] U.S. Cl. ............. 345/100; 345/197; 345/198
[58] Field of Search .................. 345/100, 197, 345/198

[56] References Cited

U.S. PATENT DOCUMENTS

| | | | |
|---|---|---|---|
| 5,313,222 | 5/1994 | Lee | 345/58 |
| 5,510,805 | 4/1996 | Lee | 345/58 |
| 5,585,815 | 12/1996 | Nakashima et al. | 345/100 |
| 5,619,223 | 4/1997 | Lee et al. | 345/93 |
| 5,648,790 | 7/1997 | Lee | 345/58 |
| 5,701,136 | 12/1997 | Huq et al. | 345/100 |
| 5,710,571 | 1/1998 | Kuo | 345/94 |
| 5,796,390 | 8/1998 | Dupont et al. | 345/204 |

*Primary Examiner*—Richard A. Hjerpe
*Assistant Examiner*—Benjamin D. Bowers
*Attorney, Agent, or Firm*—Morgan, Lewis & Bockius LLP

[57] ABSTRACT

A liquid crystal display is provided which includes a substrate, a plurality of scan lines on the substrate and a scan driver IC on the substrate. The scan driver IC includes a plurality of row selectors and each row selector includes a first input terminal for receiving a set signal, a second input terminal for receiving a reset signal, a third input terminal for receiving a shift signal, and an output terminal connected respectively to one of the plurality of scan lines to apply a driving signal according to the set signal and the reset signal.

14 Claims, 9 Drawing Sheets

Fig. 10

SCAN DRIVER IC FOR A LIQUID CRYSTAL DISPLAY

This application claims the benefit of Korean Application No. 97-00293, filed in Korea on Jan. 8, 1997, which is hereby incorporated by reference.

BACKGROUND OF THE INVENTION

1. Field of the Invention

The present invention relates to a liquid crystal display device, and more particularly, to the structure of a scan driver IC to be incorporated into the liquid crystal display device.

2. Discussion of the Related Art

The cathode ray tube (CRT) is the most widely used display device in a television set or a computer monitor, because the CRT can easily reproduce full color images at a high response speed. However, the CRT is bulky, heavy, and requires a high supply of power, making portable implementations difficult. Research and development in recent years has led to display alternatives to overcome these disadvantages of the CRT. Among these alternatives is the liquid crystal display (LCD).

The LCD can be applied to a thin television set, such as those used for mounting on the wall. This is because the LCD does not employ an electron gun as the CRT does. Furthermore, the LCD can be applied to a portable display device such as a note-book computer, because the power consumption of an LCD is low enough to be driven by a battery.

Figure 1:
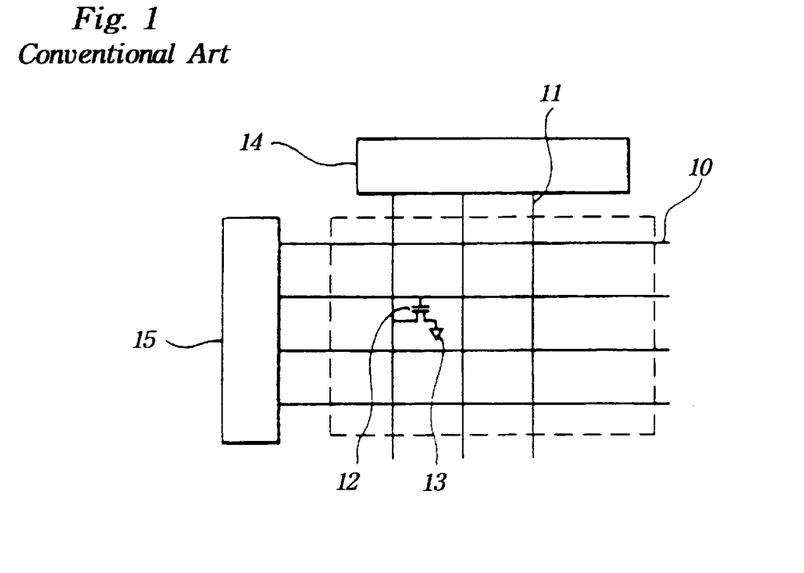
FIG. 1 shows the structure of a liquid crystal panel, a scan driver IC, and a data driver IC in a conventional liquid crystal display device.

As shown in FIG. 1, the LCD device includes a liquid crystal panel, a scan driver 15 and a data driver 14. The liquid crystal panel comprises a matrix array of a plurality of scan lines 10 and a plurality of data lines 11. At the intersections of the scan lines 10 and data lines 11, thin film transistors, such as thin film transistor (TFT) 12 are formed. At a rectangular area surrounded by two neighboring scan lines and two neighboring data lines, a pixel electrode is formed to be connected to the TFT 12. The scan driver 15 applies scan signals, which are either ON or OFF signals, to the gates of the respective TFT's 12 through the scan lines sequentially. The data driver 14 applies data signals to the data lines in order to send the image data to the pixel electrodes through the TFT's driven by the scan signal.

Figure 2:
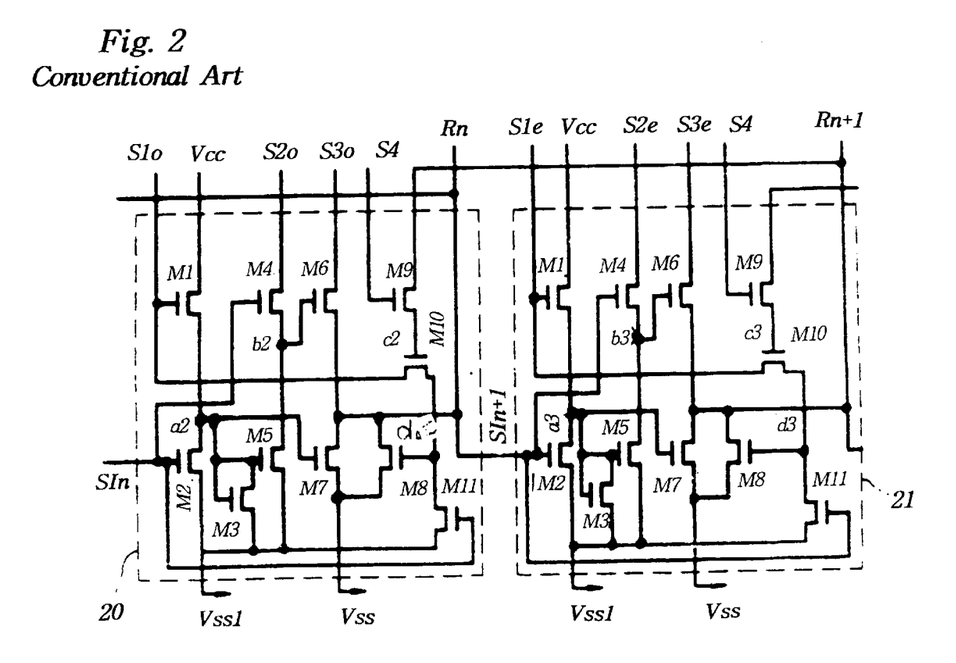
FIG. 2 shows the structure of the scan driver IC of FIG. 1.

According to the conventional art, as shown FIG. 2, the scan driver 15 includes a plurality of odd row selectors and a plurality of even row selectors connected in series. The odd row selector includes an M2 transistor having a gate connected to an SIn terminal, to which a shift input signal is applied. The M2 transistor also has a drain connected to a first common voltage Vss1. An M1 transistor has a gate connected to an S1o terminal, to which a first clock signal is applied. The M1 transistor also has a source connected to a high voltage signal Vcc and a drain connected to the source of the M2 transistor. An M4 transistor has a gate connected to the SIn terminal and a source connected to an S2o terminal, to which a second clock signal is applied. The M3, M5 and M7 transistors each have gates connected to a node a2, which connects the drain of the M1 transistor and the source of the M2 transistor. An M6 transistor has a gate connected to the drain of the M4 transistor and a source connected to a third clock signal S3O. An M11 transistor has a gate connected to the SIn terminal and a source connected to the Vss1 common voltage. An M9 transistor has a gate connected to a fourth clock signal S4, which has twice the cycle of S1o. The M9 transistor also has a source connected to the next scan line. An M10 transistor has a gate connected to the drain of the M9 transistor and a source connected to the drain of the M11 transistor An M8 transistor has a gate connected to a node d2, which is connected to the source of the M10 transistor and the drain of the M11 transistor. The M8 transistor also has a drain connected to the source of the M7 and the drain of the M6, as well as a source connected to the drain of the M7 and a second common voltage Vss.

The even selector includes an M2 transistor having a gate connected to an SIn+1 terminal, to which a shift input signal is applied. The M2 transistor also has a drain connected to the first common voltage Vss1. An M1 transistor has a gate connected to an S1e terminal, to which a first clock signal is applied. The M1 transistor also has a source connected to the high signal voltage Vcc, as well as a drain connected to the source of the M2 transistor. An M4 transistor has a gate connected to the SIn+1 terminal and a source connected to an S2e terminal, to which a second clock signal is applied. The M3, M5 and M7 transistors each have gates connected to a node a3, which connects the drain of the M1 transistor and the source of the M2 transistor. An M6 transistor has a gate connected to the drain of the M4 transistor and a source connected to a third clock signal S3c. An M11 transistor has a gate connected to the SIn+1 terminal and a source connected to the common voltage Vss1. An M9 transistor has a gate connected to a fourth clock signal S4 which has twice the cycle of the S1e clock signal. The M9 transistor also has a source connected to a next row (scan line). An M10 transistor has a gate connected to the drain of the M9 transistor and a source connected to the drain of the M11 transistor. An M8 transistor has a gate connected to a node d3, which connects the source of the M10 transistor and the drain of the M11 transistor. The M8 transistor also has a drain connected to the source of the M7 transistor and the drain of the M6 transistor. The M8 transistor has a source connected to the drain of the M7 transistor and the second common voltage Vss.

Here, the three clock signals applied to the odd row selector, S1o, S2o and S3o, and the three clock signals applied to the even row selector, S1e, S2e and S3e, have twice the cycle of the horizontal sync signal. The clock signals applied to the odd row selector have a "HIGH" pulse when the clock signals applied to the even row selector have a "LOW" pulse and vice versa. Moreover, the clock signal S4 has the same cycle as the horizontal sync signal. Because of this, the odd row selector sends the scan signal generated by the S1o, S2o, S3o and SIn signals to the scan line connected thereto. The even row selector sends the scan signal generated by the S1e, S2e, S3e and SIn+1 signals to the scan line connected thereto. When the nth row selector sends the scan signal to the nth scan line, the scan signal is sent to the next row selector as a shift signal. If the nth row selector is an odd row selector, the shift signal is sent to the SIn+1 terminal of the next (even) row signal. An initial shift signal is applied to the first row selector.

The operation of the scan driver will be explained with reference to the circuit diagram FIG. 2 and the clock signal diagram FIG. 3. Assume that the first row selector shown in FIG. 2 is an odd row selector, and the initial shift signal, in a "HIGH" state for selecting the first scan line, is applied to the SIn terminal. As a result, the M2 and M4 transistors are turned on at time t2. When the S1o and S2o terminals are in a "LOW" state, the sources and drains of the M2 and M4 transistors are also not provided with any "HIGH" signal. In this condition, the M3, M5 and M7 transistors are not turned on. Since the M4 transistor is not turned on, neither is the M6 transistor.

Figure 3:
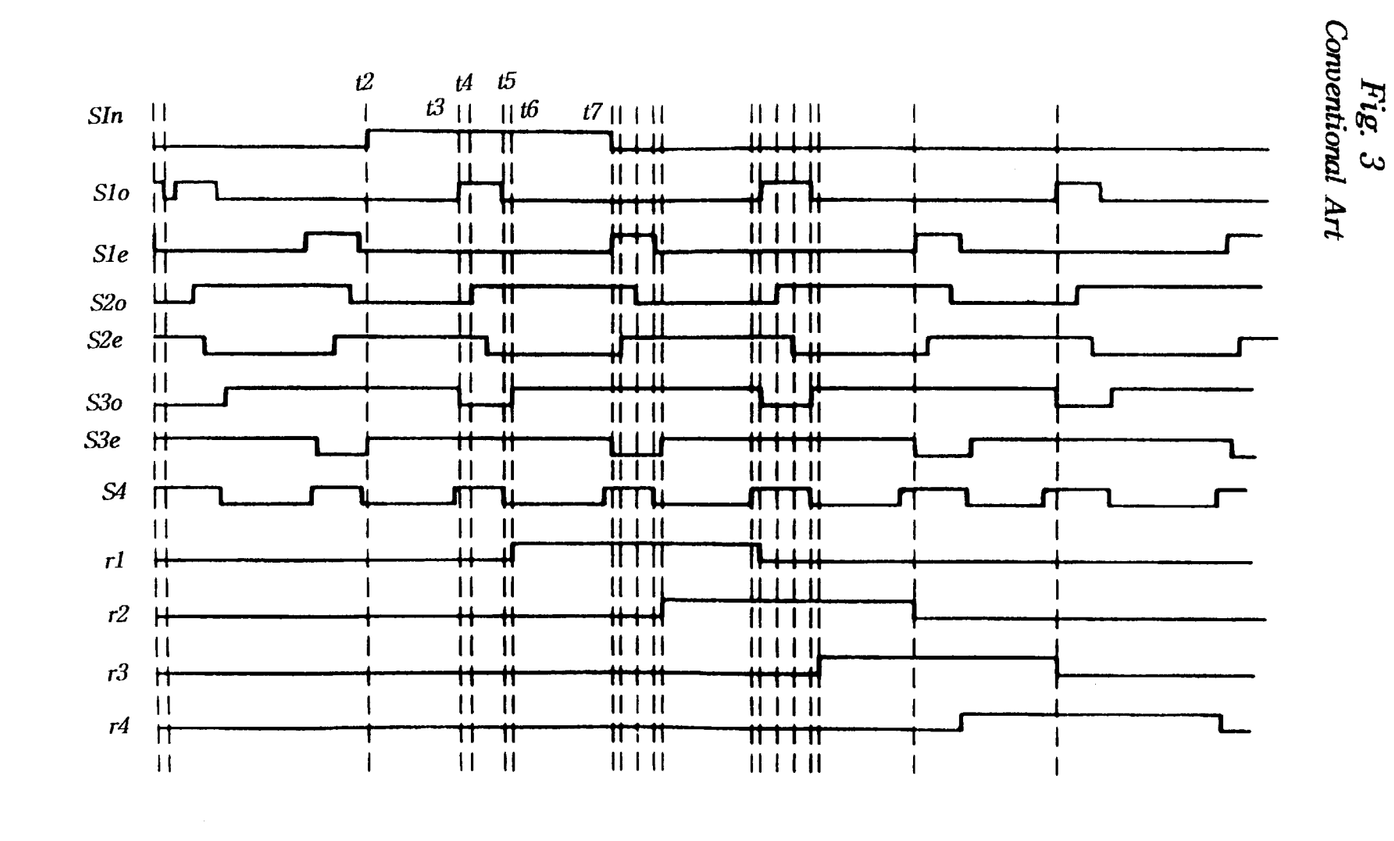
FIG. 3 shows the waveform chart for the scan driver IC of FIG. 1.

After a "HIGH" signal is applied to SIn, if the clock signal S1o generated by the horizontal sync signal is "HIGH", then the M1 transistor is turned on at time t3 (FIG. 3). Then, the M3, M5 and M7 transistors are all turned on. These transistors are connected to the node a2 connecting the M1 and M2 transistors. However, the M5 transistor is not supplied with a "HIGH" signal, because the M4 transistor is not provided with a "HIGH" signal (S2o is "LOW"). Moreover, the M7 transistor is not supplied with a "HIGH" voltage, because the M6 transistor is not turned on. Before the S1o clock signal changes to "LOW", the S2o clock signal becomes "HIGH" at time t4. So the M6 transistor is turned on by the signal of the M4 transistor through node b1 at time t4. At that time, the S2o voltage through the MS transistor passes the M11 transistor turned on by the SIn signal and turns on the M8 transistor. When the S1o signal becomes "LOW" at time t5, the M1 transistor is turned off and the M5 and M7 transistors, of which gates are connected to the node a2, are also turned off at time t5. When S1o is "LOW" and S2o is "HIGH", S1o becomes "HIGH" at time t6. At that time, the M6 transistor is turned on by the clock signal S2o, and the clock signal S2o is applied to the first scan line connected to the Rn terminal.

At the same time, the S3o clock signal is applied to the Rn+1 of the next (second) row selector for the terminal Rn+1 as a shift signal. When the S1e of the second row selector becomes "HIGH" at time t7, the SIn becomes "LOW". At that time, the M2, M4 and M11 transistors in the first row selector are turned off and the second row selector starts working in a similar manner to the first row selector, as described above.

In manufacturing a conventional LCD device, the liquid crystal panel and the driving ICs are separately manufactured and assembled using a lead wire of lead film. In recent years, there is a need for manufacturing the driving ICs directly on the liquid crystal panel. However, the conventional structure of the driving circuit is so complicated and includes so many lead lines as not to allow manufacturing of the driving circuit directly on the liquid crystal panel. Moreover, the clock signal's converting to a "HIGH" signal lags behind the horizontal sync signal's converting to a "HIGH" signal in the conventional arrangement. Because the transistor used in the driving IC includes an amorphous silicon, having a slow response time in character, a need arises to guarantee the sufficient response time of the driving IC. Consequently, it is an important point that the signals used to drive the devices should be moderated according to the character of the materials making up the driving IC. If the driving ICs are composed of polysilicon, which has a faster response time, it is difficult to precisely control the driver IC.

Furthermore, according to the wave shape of the clock signals S1, S2 and S3, their "HIGH" states are overlapped with each other. The "HIGH" state of the S3 signal causes unpredicted influences to the shift signal. Therefore, most of the TFTs are simultaneously turned on when a scan line is selected. This results in the circuit of the driving IC having a high load.

SUMMARY OF THE INVENTION

Accordingly, the present invention is directed to a liquid crystal display that substantially obviates the problems due to limitations and disadvantages of the related art.

An object of the present invention is to provide an improved liquid crystal display device including a scan driver IC which has a reduced number of input and output terminals in the scan driver IC.

Another object of the present invention is to provide a liquid crystal display including a scan driver IC wherein the "HIGH" states of the clock signals do not overlap with each other, resulting in a lower load on the circuit.

Another object of the present invention is to provide a driving IC which can be manufactured integrally with the TFT array on the same liquid crystal panel.

Another object of the present invention is Lo provide a driving IC using polysilicon to enhance the signal processing speed of the driving IC.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the liquid crystal display device includes a substrate; a plurality of scan lines or the substrate; and a scan driver IC on the substrate having a plurality of row selectors, each row selector including a first input terminal for receiving a set signal, a second input terminal for receiving a reset signal, a third input terminal for receiving a shift signal, and an output terminal connected respectively to one of the plurality of scan lines to apply a driving signal according to the set signal and the reset signal.

In another aspect of the present invention, a scan driver IC having a plurality of line selectors is provided where each of the line selectors includes a first input terminal for receiving a set signal; a second input terminal for receiving a reset signal; a third input terminal for receiving an input shift signal; and an output terminal for outputting a driving signal generated by the set signal and the reset signal.

In another aspect of the present invention, a scan driver circuit for driving a plurality of scan lines of a liquid crystal display is provided where the scan driver circuit includes a first clock signal input terminal for receiving a first clock signal; a second clock signal input terminal for receiving a second clock signal; a third clock signal input terminal for receiving a third clock signal; a fourth clock signal input terminal for receiving a fourth clock signal; and a plurality of line selectors serially connected to each other and consecutively numbered in that order, each of the line selectors including a first input terminal; a second input terminal; a third input terminal for receiving a shift signal; and an output terminal for outputting a driving pulse to each of the plurality of scan lines, wherein each line selector outputting the driving pulse in accordance with signals input through the first, second, and third input terminals, the duration of the driving pulse being determined only by timings of the signals input through the first and second input terminals, the output terminal of each line selector being connected to the next line selector to provide the driving pulse as the shift signal for the next line selector, wherein the third input terminal of the first line selector receives a starting clock signal as the shift signal, wherein the first input terminals of odd numbered line selectors are all connected to the first clock signal input terminal, and the second input terminals of the odd numbered line selectors are all connected to the second clock signal input terminal, and wherein the first input terminals of even numbered line selectors are all connected to the third clock signal input terminal, and the second input terminals of the even numbered line selectors are all connected to the fourth clock signal input terminal.

In a further aspect of the present invention, a scan driver circuit for driving a plurality of scan lines of a liquid crystal display is provided, the scan driver circuit including a first clock signal input terminal for receiving a first clock signal; a second clock signal input terminal for receiving a second clock signal; a third clock signal input terminal for receiving a third clock signal; a fourth clock signal input terminal for receiving a fourth clock signal; and a plurality of line selectors serially connected to each other and consecutively numbered in that order, each of the line selectors including a first input terminal; a second input terminal; a third input terminal for receiving a shift signal; a first output terminal for outputting a driving pulse to each of the plurality of scan lines; and a second output terminal for outputting the shift signal to the third input terminal of the next line selector, wherein each of the line selectors outputs the driving pulse in accordance with signals input through the first, second, and third input terminals, the duration of the driving pulse being determined only by timings of the signals input through the first and second input terminals, wherein the third input terminal of the first line selector receives a starting clock signal as the shift signal, wherein the first input terminals of odd numbered line selectors are all connected to the first clock signal input terminal, and the second input terminals of the odd numbered line selectors are all connected to the second clock signal input terminal, and wherein the first input terminals of even numbered line selectors are all connected to the third clock signal input terminal, and the second input terminals of the even numbered line selectors are all connected to the fourth clock signal input terminal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

First Preferred Embodiment

Figure 4:
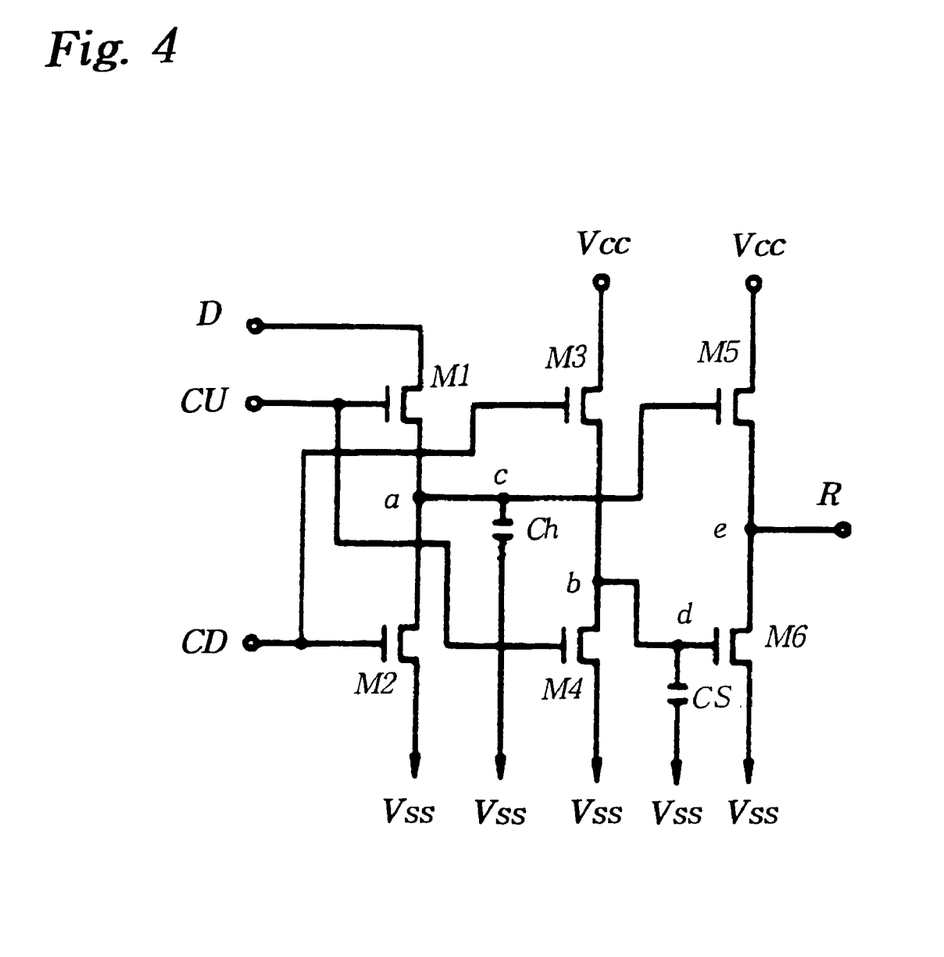
FIG. 4 shows an example of a row selector in a scan driver IC according to a first preferred embodiment of the present invention.

A row selector according to a first preferred embodiment of the present invention includes, as shown in FIG. 4, a D input terminal for receiving a shift signal; a CU input terminal for receiving a set signal; a CD input terminal for receiving a reset signal; an M1 transistor having a gate connected to the CU terminal and a source connected to the D terminal; an M2 transistor having a source connected to the drain of the M1 transistor; a gate connected to the CD terminal, and a drain connected to a common voltage Vss; an M3 transistor having a gate connected to the CD terminal and a source connected to a high signal voltage Vcc; an M4 transistor having a gate connected to the CU input terminal, a source connected to the drain of the M3 transistor, and a drain connected to the common voltage Vss; an M5 transistor having a gate connected to a node "a" connecting the drain of the M1 and the source of the M2, and a source connected to Vcc; an M6 transistor having a gate connected to a node "b" connecting the drain of the M3 transistor and the source of the M4 transistor, a source connected to the drain of the M5 transistor, and a drain connected to the Vss; a first capacitor Ch having an electrode connected to a node "c" connecting the node "a" and the gate of the M5 transistor and another electrode connected to the common electrode Vss; a second capacitor Cs having an electrode connected to a node "d" connecting the node "b" and the gate of the M6 transistor and another electrode connected to the common voltage Vss; and an output terminal R connected to a node "e" connecting the drain of the M5 transistor and the source of the M6 transistor.

Figure 5:
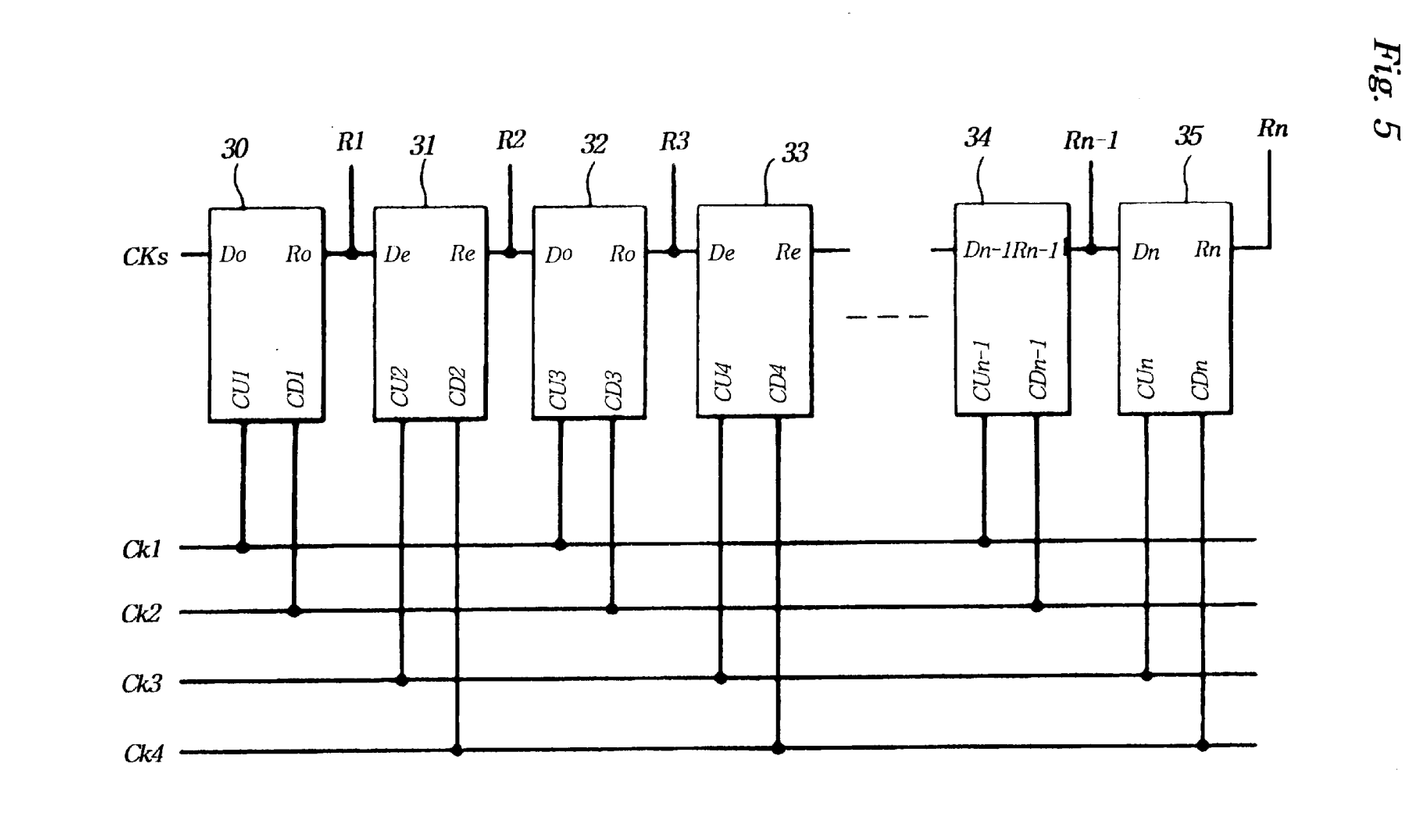
FIG. 5 shows the structure of the scan driver IC in which the row selectors of FIG. 4 are serially connected to each other according to the first preferred embodiment of the present invention.

The scan driving IC includes a plurality of the row selectors described above serially connected. The output terminal R is connected to the D terminal of the next row selector, as shown in FIG. 5. The odd row selectors are provided with set signals from the CK1 clock signal, and reset signals from the CK2 clock signal. The even row selectors are provided with the set signals from the CK3 clock signal and the reset signals from the CK4 clock signal. The input terminal for the shift signal of the first row selector is supplied with a start pulse CKs.

Figure 6:
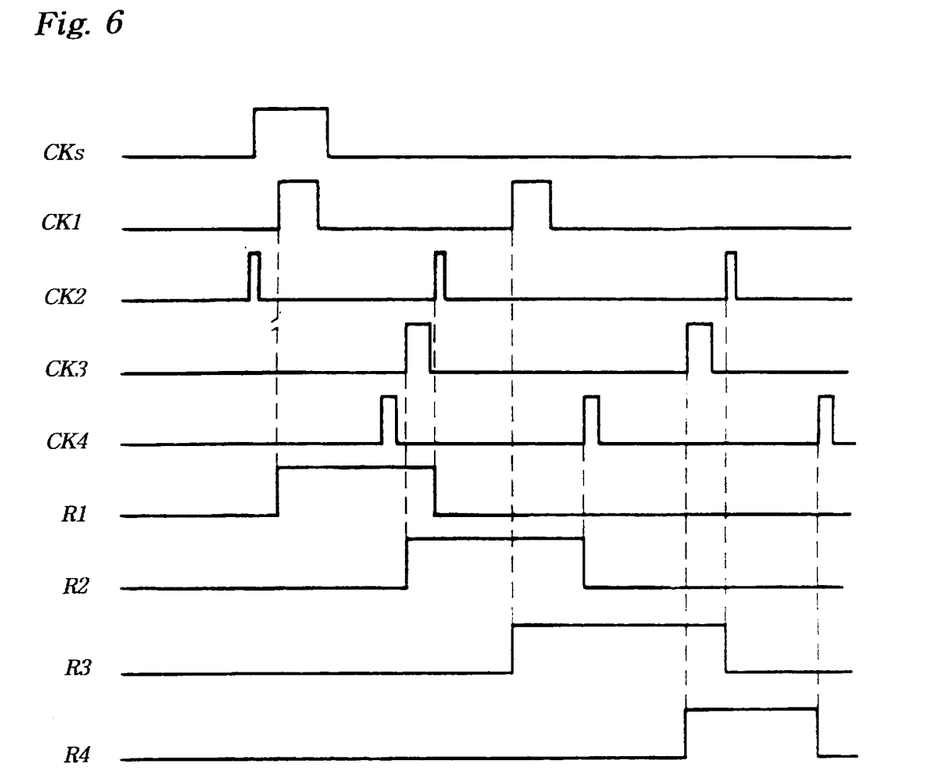
FIG. 6 shows the waveform chart for the scan driver IC of FIG. 5.

The wave form of the CK1, CK2, CK3 and CK4 signals have the same cycle, as shown in FIG. 6, and follow a rule as follows. After the CK1 signal has pulsed once and before the CK1 rises to a "HIGH" level, the CK2 signal has one pulse. After the CK1 signal goes from "HIGH" to "LOW" and before the CK2 is "HIGH", the CK3 has one pulse. After the CK3 goes from a "HIGH" to "LOW" level and before the CK3 becomes "HIGH" again, the CK4 has one pulse.

Referring to the structure of the driving IC, shown in FIGS. 4 and 5 and the waveform of FIG. 6, operation of the first preferred embodiment of the present invention is described below in detail. At the first row selector, during the ON ("HIGH") signal of the CKs applied to the shift terminal, the M1 and M4 transistors are turned on because of the ON ("HIGH") signal from the CK1. When the M2 transistor is not turned on, the CKs signal is sent to the gate of the M5 transistor through the node "a". Therefore the M5 transistor is turned on. The CKs signal ("HIGH") is stored at the capacitor Ch located between the gate of the M5 and the node "a". At this point, the M6 transistor is also not turned on. Thus, Vcc is applied to the Ro terminal through the M5 transistor. Hence, the first scan line R1 is selected. When the CK1 becomes "LOW", the M1 transistor is turned off. Then the Ch capacitor is no longer supplied with a "HIGH" signal and the Ch capacitor begins discharging. However, the M1 and the M2 transistors are turned off, and thus the discharged signal is supplied to the gate of the M5 transistor. Therefore, the M5 transistor is turned on and a "HIGH" signal is applied to the Ro terminal in spite of the CK1 signal being "LOW".

The CK3 signal is "HIGH" before the CK2 is "HIGH". At that time, the output terminal Ro of the first row selector has a "HIGH" signal and the "HIGH" signal is applied to the De terminal of the second row selector. The source of the M1 transistor of the second selector, which is turned on by the CK3 signal, is provided with the "HIGH" signal of the Ro terminal, and the M5 transistor of the second selector is turned on. Thus, a "HIGH" signal is applied to the Re terminal of the second row selector. This results in the second scan line R2 being selected. That is, the Ro terminal of the first row selector provides the shift signal to the De terminal of the second row selector, during the time the CK3 signal is in a "HIGH" state. And the "HIGH" signal of the Re terminal of the second row selector is a shift signal of the Do terminal of the third row selector. When the CK3 signal is "LOW", the stored shift signal at the capacitor Ch of the second selector turns on the MS transistor. So, the Re terminal of the second row selector outputs a "HIGH" signal.

The CK2 signal is "HIGH" after the CK3 signal becomes "LOW". At that time, the M2 transistor and the M3 transistor of the first row selector are turned on. So, the discharging signal voltage from the capacitor Ch is not applied to the gate of the MS transistor of the first row selector. Therefore, the MS transistor of the first row selector is turned off. At the same time, in the first row selector, the Vcc is applied to the M6 transistor and to the Cs capacitor through the M3 transistor. As a result, the M6 transistor is turned on and the common voltage Vss is applied to the output terminal Ro. Therefore, the Ro terminal of the first row selector is "LOW". That is, the first scan line R1 is unselected. The M6 transistor is still turned on even when the CK2 signal becomes "LOW", because the M2 and the M3 transistors are turned off and the high signal stored at the Cs capacitor is discharged to the gate of the M6 transistor of the first row selector.

The second "HIGH" level of the CK1 signal is applied before the CK4 signal is "HIGH". At that time, the "HIGH" signal of the Re terminal of the second row selector is applied to the Do terminal of the third row selector. As a result, the M1 transistor of the third row selector is turned on by the "HIGH" level of the CK1 signal, and the MS transistor is turned on by the "HIGH" level of the Do terminal through the M1 transistor. Therefore, the "HIGH" signal is supplied to the Ro terminal of the third row selector. That is, the third scan line is selected. The "HIGH" signal of the Re terminal of the second row selector is a shift signal of the third row selector during the period that the CK1 signal is in a "HIGH" state. Similarly, the "HIGH" signal of the Ro terminal of the third row selector is a shift signal for the fourth row selector, during the period that the CK3 signal is in a "HIGH" state.

The CK4 signal is "HIGH" after the CK1 signal is "LOW". At that time, the M2 and M3 transistors of the second row selector are turned on. As a result, the discharging voltage from the Ch capacitor passes through the M2 transistor, not being applied to the gate of the M5 transistor. Therefore, the M5 transistor is turned off. At the same time, the M6 transistor is turned on, because the Vcc is applied to the M6 transistor and the Cs capacitor through the M3 transistor. As a result, the common voltage Vss is applied to the Re terminal of the second row selector. That is, the second scan line is unselected. When the CK4 is "LOW", the M6 transistor is still turned on, because the M2 and M3 transistors are turned off and the stored voltage at the Cs capacitor is applied to the gate of the M6 transistor of the second row selector. Therefore, the Re terminal of the second row selector maintains its "LOW" state.

Second Preferred Embodiment

Figure 7:
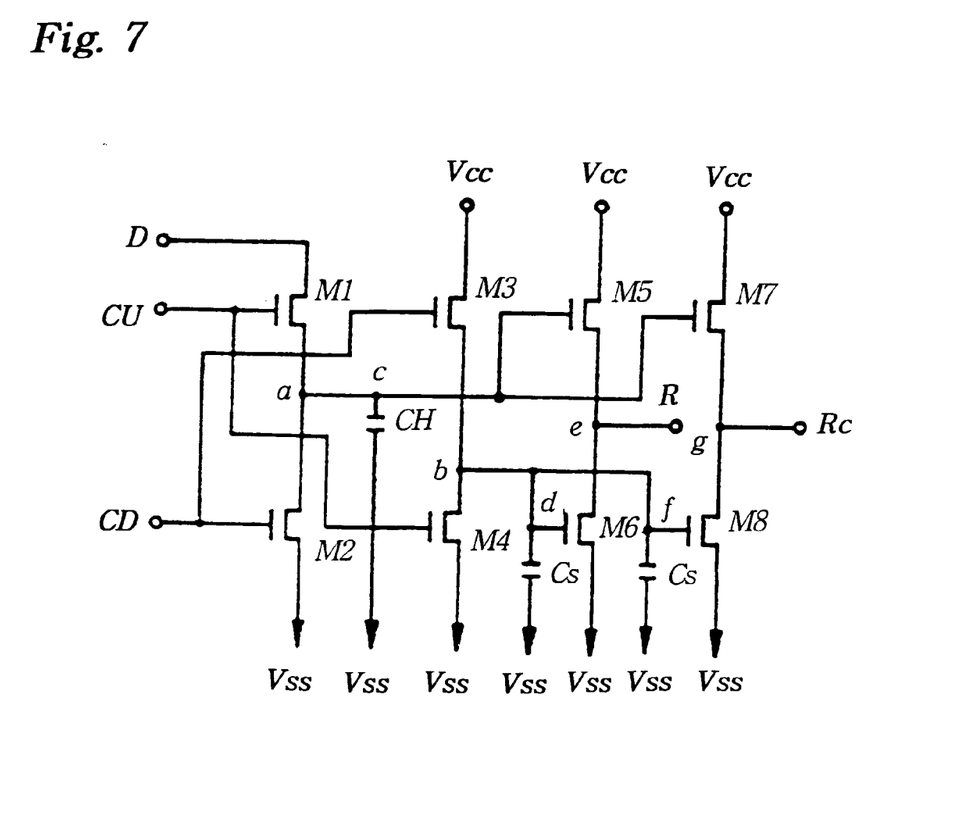
FIG. 7 shows another example of a row selector in a scan driver IC according to a second preferred embodiment of the present invention.
Figure 8:
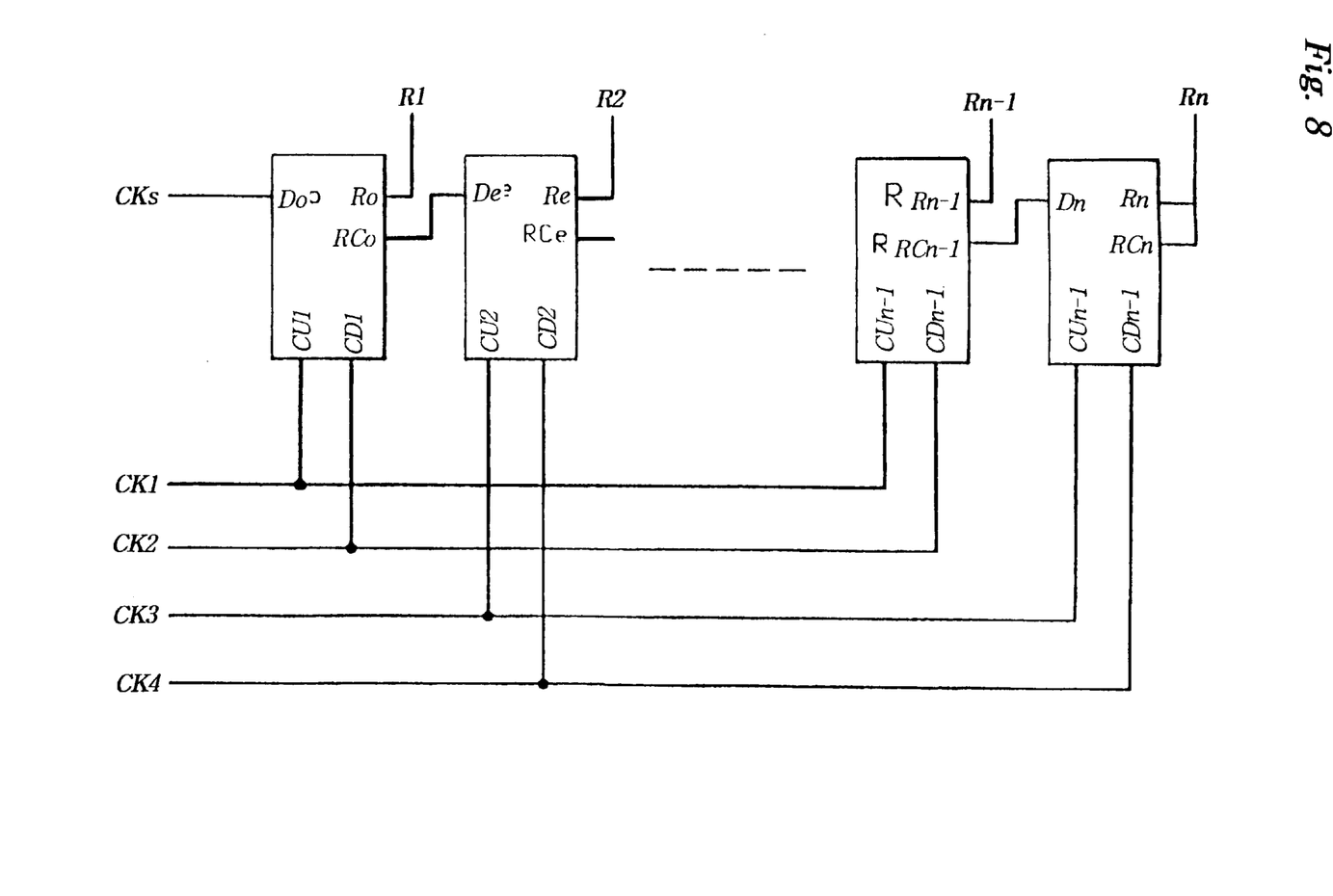
FIG. 8 shows the structure of the scan driver IC in which the row selectors of FIG. 7 are serially connected to each other according to the second preferred embodiment of the present invention.

A row selector according to a second preferred embodiment of the present invention is shown in FIG. 7. The driving IC includes a plurality of such row selectors connected to each other serially, as shown in FIG. 8.

In addition to the circuit elements shown in FIG. 4, the row selector according to the present embodiment further includes an M7 transistor having a gate connected to the gate of the M5 transistor, and a source connected to the high voltage Vcc. An M8 transistor is also provided. The M8 transistor has a gate connected to the gate of the M6 transistor, a drain connected to the common voltage Vss, and a source connected to the drain of the M7 transistor. A Cs' capacitor, which has a first electrode connected to the gate of the M8 transistor, and a second electrode connected to the common voltage Vss, is also provided. An output terminal Rc is connected to a node "g" connecting the drain of the M7 transistor and the source of the M8 transistor.

This scan driver IC arrangement according to the present embodiment, which has the serially connected row selectors, is similar to that of the first preferred embodiment. In this second embodiment, the R terminal is connected to the scan line, and the Rc terminal is connected to the D terminal of the next row selector.

Also, the operation of the second preferred embodiment is similar to that of the first preferred embodiment. In the second preferred embodiment, the M5 and M7 transistors are turned on and off at the same time, and the M6 and M8 transistors are turned on and off at the same time. As a result, the waveform of the output signal from the R terminal is similar to that from the Rc terminal.

Referring to the first and second preferred embodiments above, the structure of the scan driver IC is simpler than that of the conventional art. Moreover, the elements of the scan driver IC include TFTs and capacitors, composed of the same material as the TFT array. Therefore, the scan driver IC can be manufactured by the same process for manufacturing the TFT array, and accordingly integrally formed on the same substrate.

In the manufacturing of the LCD panel having the scan driver IC and the TFT array on the same substrate, if an error occurs in the scan driver IC, then the whole LCD panel can not be used. The following embodiments present methods for solving the problem of the error that may occur when the scan driver IC is manufactured on the same substrate as the TFT array.

Third Preferred Embodiment

A third preferred embodiment includes a TFT array on a substrate, a plurality of scan driver ICs on the substrate, and a plurality of switching elements whose switching electrodes are commonly connected, wherein each of the switching elements connects the output terminal of the scan driver IC to the scan line of the TFT array. Moreover, at each scan line, the two or more output terminals of the scan driver IC are connected in parallel. Thus, if one of the output terminals of the scan driver IC has an error, then the one switching element connected to it can be cut off. The output signal can then be applied to the scan line through the other output terminal.

Figure 9:
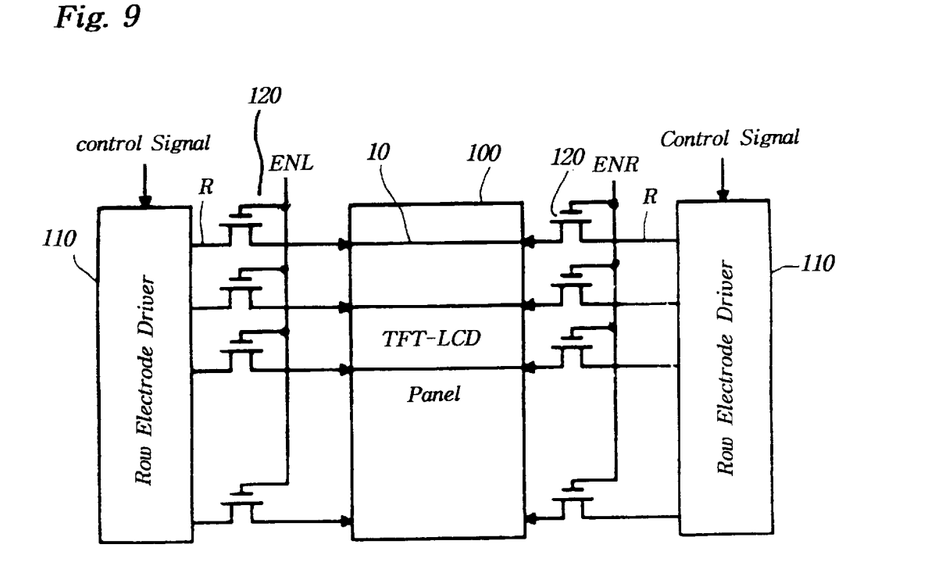
FIG. 9 shows an example of the structure of the liquid crystal display device having a plurality of scan driver ICs and switching elements according to a third preferred embodiment of the present invention.

Referring to FIG. 9, the present embodiment will now be explained in detail. When the TFT array is manufactured on a substrate, the scan driver IC including TFTs, as described in the first and second embodiments, is formed on the same substrate. Here, at both sides of the TFT array, two scan driver ICs are formed. A plurality of TFTs as switching elements are formed between the TFT array and each scan driver IC. The scan lines are connected to the drains (or sources) of the switching elements, and the output terminals of the scan driver ICs are connected to the sources (or drains) of the switching elements. Here, one scan line is connected to the two scan driver ICs through the two switching elements. The gates of switching elements on the one side (the right side of the TFT array) are commonly connected to the ENR terminal. Also, the gates of switching elements in the other side (the left side of the TFT array) are commonly connected to the ENL terminal.

Consequently, one scan line has two scan driver IC's, one at each end. Once the LCD panel is completely manufactured, if, at the testing process, one of the driver IC's has an error, then that one may be disconnected. The other scan driver IC remains connected to drive the scan line.

Fourth Preferred Embodiment

Figure 10:
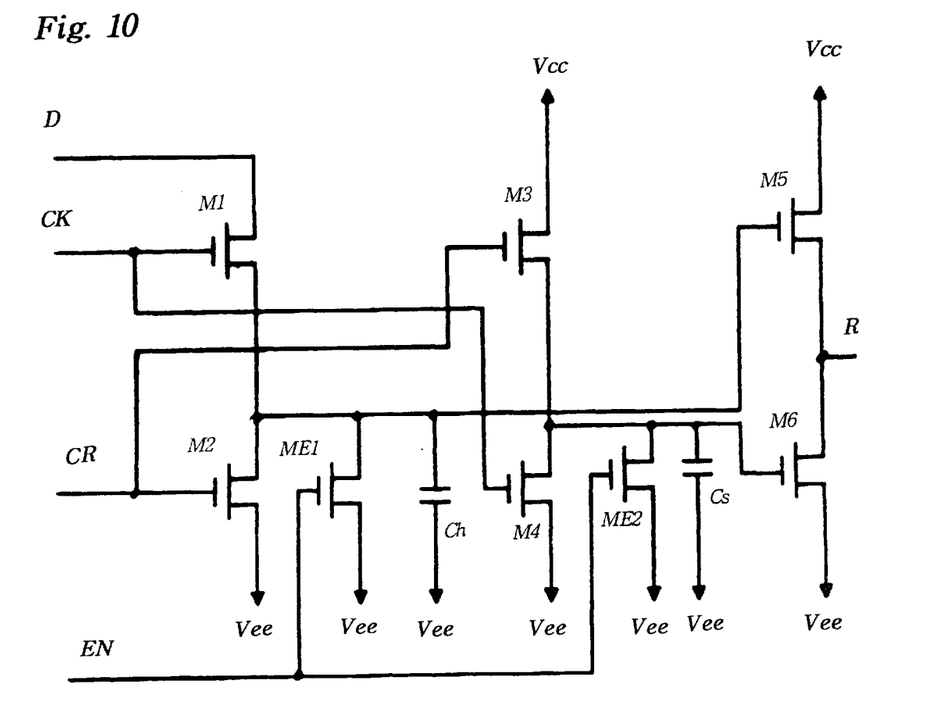
FIG. 10 shows still another example of the structure of the row selector having additional switching elements in the scan driver IC according to a fourth preferred embodiment of the present invention.

In the above described third preferred embodiment, the switching elements are formed outside the scan driver IC. A fourth preferred embodiment, on the other hand, presents a structure in which the scan driver IC has the switching elements incorporated therein, as shown in FIG. 10.

This embodiment includes a plurality of row selectors. The driver IC includes a CK input terminal for receiving a set signal. A CR input terminal is provided for receiving a reset signal. An R output terminal is provided for applying a driving signal to the scan line. A D input terminal is provided for receiving a shift signal. This fourth embodiment further includes ME1 and ME2 transistors, each having gates connecting to an EN input terminal. Here, if a row selector malfunctions, then that particular row selector can be deactivated by applying a "HIGH" signal to the EN input terminal.

The third preferred embodiment has a TFT for switching the scan signal. So, there is a small voltage drop in the scan line according to the resistance of the TFT used as a switching element. As a result, the driving voltage should be large enough to maintain the driving level. However, this embodiment has two TFTs for switching the row selector. This results in no voltage distortion in the scan signal.

According to the present invention, the structure of the scan driver IC is simplified in comparison with the prior art arrangement for at least the following reasons. First, the number of transistors required in the arrangement is less than that of the conventional art. Furthermore, the number of terminals is less than that of conventional art. Thus, it is simpler to connect the scan driver IC according to the present invention to the TFT array. Additionally, the material of the scan driver IC can be amorphous silicon or polysilicon. Therefore, the scan driver IC can be manufactured with the TFT array at the same time on the same substrate, resulting in reduced costs and higher production rates.

Furthermore, in generating a row selection signal, the pulse width of clock signals (CK1, CK2, CK3, and CK4) need not be considered. Moreover, the application period of the high signal at the scan line is controlled by changing the cycle of the clock signals. Thus, control of the scan driver IC of the instant invention is greatly facilitated in comparison with the conventional art.

It will be apparent to those skilled in the art that various modifications and variations can be made in the scan driver IC for a liquid crystal display of the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising:
    a substrate;
    a plurality of scan lines on the substrate; and
        a scan driver IC on the substrate having a plurality of row selectors, each row selector including a first input terminal for receiving a set signal, a second input terminal for receiving a reset signal, a third input terminal for receiving a shift signal, and an output terminal connected respectively to one of the plurality of scan lines to apply a driving signal having a pulse duration determined only by the timings of the set signal and the reset signal,
        wherein HIGH states of said set signal and said reset signal are not applied simultaneously to the scan driver IC.

2. The liquid crystal display device according to claim 1, wherein the scan driver IC further comprises:
    a first transistor having a gate, a source, and a drain, the gate being connected to the first input terminal, and the source being connected to the third input terminal;
    a second transistor having a gate, a source, and a drain, the gate being connected to the second input terminal, the source being connected to the drain of the first transistor, and the drain being connected to a common voltage Vss;
    a third transistor having a gate, a source, and a drain, the gate being connected to the second input terminal and the source being connected to a high voltage Vcc;
    a fourth transistor having a gate, a source and a drain, the gate being connected to the first input terminal, the source connected to the drain of the third transistor, and the drain connecting to the common voltage Vss;
    a fifth transistor having a gate, a source and a drain, the gate being connected to the drain of the first transistor and the source of the second transistor, and the source being connected to the high voltage Vcc;
    a sixth transistor having a gate, a source and a drain, the gate being connected to the drain of the third transistor and the source of the fourth transistor, the source being connected to the drain of the fifth transistor, and the drain being connected to the common voltage Vss;
    a first capacitor having a first electrode connected to the common voltage Vss, and a second electrode connected to the gate of the fifth transistor, the drain of the first transistor, and to the source of the second transistor; and
    a second capacitor having a first electrode connected to the common voltage Vss, and a second electrode connected to the gate of the sixth transistor, the drain of the third transistor, and the source of the fourth transistor;
    wherein the output terminal is connected to the drain of the fifth transistor and the source of the sixth transistor.

3. The liquid crystal display device according to claim 2, wherein the scan driver IC further comprises:

a seventh transistor having a source being connected to the high voltage Vcc, and a gate connected to the drain of the first transistor, the source of the second transistor, and to the gate of the fifth transistor;

an eighth transistor having a drain connected to the common voltage Vss, a source connected to the drain of the seventh transistor, and a gate connected to the drain of the third transistor, the source of the fourth transistor, and to the gate of the sixth transistor;

a third capacitor having a first electrode connected to the common voltage Vss, and a second electrode connected to the gate of the eighth transistor, the drain of the third transistor, the source of the fourth transistor, the gate of the sixth transistor, and to the second electrode of the Cs capacitor; and a second output terminal connected to the drain of the seventh transistor and the source of the eighth transistor.

4. The liquid crystal display device according to claim 1, further comprising:

a plurality of data lines on the substrate crossing the plurality of scan lines;

a pixel at each of the scan and data line intersections on the substrate; and a plurality of thin film transistors, each having a gate connected to one of the plurality of scan lines, a source connected to one of the plurality of data lines, and a drain connected to a respective pixel, wherein the thin film transistors and said scan driver IC are simultaneously and integrally formed on the substrate.

5. A liquid crystal display device according to claim 1, further comprising;

a plurality of data lines, each perpendicularly intersecting with the plurality of scan lines on the substrate in a rectangular array;

a plurality of pixels, each of the pixels being arranged near an intersection of a respective scan line and a respective data line on the substrate;

a plurality of thin film transistors, each of the thin film transistors having a gate connected to one of the plurality of scan lines, a source connected to one of the plurality of data lines and a drain connected to a respective pixel; and at least one additional scan driver IC on the substrate having a plurality of row selectors, each row selector including a first input terminal for receiving a set signal, a second input terminal for receiving a reset signal, a third input terminal for receiving a shift signal, and an output terminal connected respectively to one of the plurality of scan lines to apply a driving signal according to the set signal and the reset signal, which are input to the row selector of the at least one additional scan driver IC, wherein said plurality of thin film transistors, said scan driver IC, and the at least one scan driver IC are simultaneously and integrally formed on the same substrate.

6. The liquid crystal display device according to claim 5, wherein the output terminal of the nth row selector is connected to the third input terminal of the (n+1)th row selector, and the nth scan line is connected to the output terminal of the nth row selector.

7. The liquid crystal display device according to claim 1, further comprising:

a plurality of first switching elements, each connected to a first end of a respective scan line;

a plurality of second switching elements, each connected to a second end of the respective scan line; and one additional scan driver IC on the substrate having a plurality of row selectors, each row selector comprising a first input terminal for receiving a set signal, a second input terminal for receiving a reset signal, a third input terminal for receiving a shift signal, and an output terminal connected to a respective one of the plurality of scan lines to apply a driving signal according to the set signal and the reset signal input into the row selector of the one additional scan driver IC;

wherein each of the output terminals of the scan driver IC is connected to a respective one of the first switching elements, and each of the output terminals of the one additional scan driver IC is connected to a respective one of the second switching elements.

8. The liquid crystal display device according to claim 7, wherein each of the first and second switching elements includes a thin film transistor having:

a gate for receiving an enable signal;

a source connected to a respective output terminal of one of the scan driver IC's; and a drain connected to one of the first or second ends of the scan line.

9. A scan driver IC having a plurality of line selectors, each of the line selectors comprising:

a first input terminal for receiving a set signal;

a second input terminal for receiving a reset signal;

a third input terminal for receiving an input shift signal; and an output terminal for outputting a driving signal having a pulse duration determined only by the timings of the set signal and the reset signal, wherein HIGH states of said set signal and said reset signal are not applied simultaneously to the scan driver IC.

10. The scan driver IC according to claim 9, wherein each of the line selectors further comprises:

a first transistor having a gate connected to the first input terminal, and a source connected to the third input terminal;

a second transistor having a gate connected to the second input terminal, a source connected to a drain of the first transistor, and a drain connected to a common electrode Vss;

a third transistor having a gate connected to the second input terminal and a source connected to a high voltage Vcc;

a fourth transistor having a gate connected to the first input terminal, a source connected to the drain of the third transistor, and a drain connected to the common voltage Vss;

a fifth transistor having a source connected to the high voltage Vcc, and a gate connected to the drain of the first transistor and to the source of the second transistor;

a sixth transistor having a source connected to a drain of the fifth transistor, a drain connected to the common voltage Vss, and a gate connected to a drain of the third transistor and to the source of the fourth transistor;

a first capacitor having a first electrode connected to the common voltage Vss and a second electrode connected to the gate of the fifth transistor, the drain of the first transistor, and to the source of the second transistor; and a second capacitor having a first electrode connected to the common voltage Vss, and a second electrode connected to the gate of the sixth transistor, the drain of the third transistor, and to the source of the fourth transistor;

whereas the output terminal is connected to the drain of the fifth transistor and to the source of the sixth transistor.

11. The scan driver IC according to claim 10, wherein each line selector further comprises:

a seventh transistor having a source connected to the high voltage Vcc, and a gate connected to the drain of the first transistor, the source of the second transistor, and to the gate of the fifth transistor;

an eighth transistor having a source connected to a drain of the seventh transistor, a drain connected to the common voltage Vss, and a gate connected to the drain of the third transistor, the source of the fourth transistor, and the gate of the sixth transistor;

a third capacitor having a first electrode connected to the common voltage Vss, and a second electrode connected to the gate of the eighth transistor, the gate of the sixth transistor, the drain of the third transistor, the source of the fourth transistor, and to the second electrode of the second capacitor; and a second output terminal connected to the drain of the seventh transistor and the source of the eighth transistor.

12. The scan driver IC according to claim 10, wherein the line selector further comprises:

a control terminal for receiving an enable signal;

a first switching transistor having a gate connected to the control terminal, a drain connected to the common voltage Vss, and a source connected to the second electrode of the first capacitor, the gate of the fifth transistor, the drain of the first transistor, and to the source of the second transistor; and a second switching transistor having a gate connected to the control terminal, a drain connected to the common voltage Vss, and a source connected to the second electrode of the second capacitor, the gate of the sixth transistor, the drain of the third transistor, and to the source of the fourth transistor.

13. A scan driver circuit for driving a plurality of scan lines of a liquid crystal display, the scan driver circuit comprising:

a first clock signal input terminal for receiving a first clock signal;

a second clock signal input terminal for receiving a second clock signal;

a third clock signal input terminal for receiving a third clock signal;

a fourth clock signal input terminal for receiving a fourth clock signal; and a plurality of line selectors serially connected to each other and consecutively numbered in that order, each of the line selectors including:

a first input terminal;

a second input terminal;

a third input terminal for receiving a shift signal; and an output terminal for outputting a driving pulse to each of the plurality of scan lines, wherein each line selector outputting the driving pulse in accordance with signals input through the first, second, and third input terminals, the duration of the driving pulse being determined only by timings of the signals input through the first and second input terminals, the output terminal of each line selector being connected to the next line selector to provide the driving pulse as the shift signal for the next line selector, wherein the third input terminal of the first line selector receives a starting clock signal as the shift signal, wherein the first input terminals of odd numbered line selectors are all connected to the first clock signal input terminal, and the second input terminals of the odd numbered line selectors are all connected to the second clock signal input terminal, wherein the first input terminals of even numbered line selectors are all connected to the third clock signal input terminal, and the second input terminals of the even numbered line selectors are all connected to the fourth clock signal input terminal, and wherein HIGH states of the first, second, third, and fourth clock signals are not applied simultaneously to the scan driver circuit.

14. A scan driver circuit for driving a plurality of scan lines of a liquid crystal display, the scan driver circuit comprising:

a first clock signal input terminal for receiving a first clock signal;

a second clock signal input terminal for receiving a second clock signal;

a third clock signal input terminal for receiving a third clock signal;

a fourth clock signal input terminal for receiving a fourth clock signal; and a plurality of line selectors serially connected to each other and consecutively numbered in that order, each of the line selectors including:

a first input terminal;

a second input terminal;

a third input terminal for receiving a shift signal;

a first output terminal for outputting a driving pulse to each of the plurality of scan lines; and a second output terminal for outputting the shift signal to the third input terminal of the next line selector, wherein each of the line selectors outputs the driving pulse in accordance with signals input through the first, second, and third input terminals, the duration of the driving pulse being determined only by timings of the signals input through the first and second input terminals, wherein the third input terminal of the first line selector receives a starting clock signal as the shift signal, wherein the first input terminals of odd numbered line selectors are all connected to the first clock signal input terminal, and the second input terminals of the odd numbered line selectors are all connected to the second clock signal input terminal, wherein the first input terminals of even numbered line selectors are all connected to the third clock signal input terminal, and the second input terminals of the even numbered line selectors are all connected to the fourth clock signal input terminal, and wherein HIGH states of the first, second, third, and fourth clock signals are not applied simultaneously to the scan driver circuit.

* * * * *